United States Patent
Saito et al.

(10) Patent No.: US 7,365,341 B2
(45) Date of Patent: Apr. 29, 2008

(54) GAS CLUSTER ION BEAM EMITTING APPARATUS AND METHOD FOR IONIZATION OF GAS CLUSTER

(75) Inventors: Tetsuro Saito, Isehara (JP); Tatsumi Shoji, Hiratsuka (JP); Yoichi Fukumiya, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 216 days.

(21) Appl. No.: 11/290,541

(22) Filed: Dec. 1, 2005

(65) Prior Publication Data

US 2006/0118731 A1 Jun. 8, 2006

(30) Foreign Application Priority Data

Dec. 3, 2004 (JP) .............................. 2004-351541

(51) Int. Cl.
*H01J 27/00* (2006.01)
*H01T 23/00* (2006.01)

(52) U.S. Cl. ................. 250/427; 250/423; 250/492.21; 250/492.1; 355/33; 315/111.81; 118/723; 438/710

(58) Field of Classification Search ................. 250/423, 250/427, 492.21, 492.1; 355/33; 315/111.81; 118/723; 438/710
See application file for complete search history.

(56) References Cited

U.S. PATENT DOCUMENTS

| | | | |
|---|---|---|---|
| 6,797,339 B2 | 9/2004 | Akizuki et al. | ............. 427/562 |
| 2002/0015803 A1 | 2/2002 | Akizuki et al. | ............. 427/585 |
| 2002/0162508 A1* | 11/2002 | Dykstra | ............... 118/723 CB |

FOREIGN PATENT DOCUMENTS

| | | |
|---|---|---|
| JP | 08-120470 | 5/1996 |
| JP | 08-127867 | 5/1996 |
| JP | 09-041122 | 2/1997 |

* cited by examiner

*Primary Examiner*—Jack Berman
*Assistant Examiner*—Meenakshi S Sahu
(74) *Attorney, Agent, or Firm*—Fitzpatrick, Cella, Harper & Scinto

(57) ABSTRACT

An emitting apparatus 50 has a gas cluster generation chamber 2 and a nozzle 3 as means for generating a gas cluster and emitting the gas cluster to a processing object 10. A group of gas clusters jetted from the nozzle 3 is shaped into a gas cluster stream 8 in a beam form when passing through a skimmer 4. Electrons are emitted from an electron gun 12 to the gas cluster stream 8, whereby the gas cluster in the gas cluster stream is ionized.

9 Claims, 3 Drawing Sheets

GAS CLUSTER ION BEAM EMITTING APPARATUS AND METHOD FOR IONIZATION OF GAS CLUSTER

BACKGROUND OF THE INVENTION

1. Field of the Invention

The present invention relates to a gas cluster ion beam emitting apparatus emitting a gas cluster ion to a processing object to subject the processing object to desired processing and a method for ionization of a gas cluster.

2. Related Background Art

For the purpose of the surface rinsing of an electric device, surface modification by ion injection, formation of a thin film or the like, various kinds of vapor phase reaction methods have been developed, and for example, processes such as sputtering, vacuum deposition, CVD and ion beam vapor deposition have been brought into practical use. However, in these methods, the degree to which the surface of a processing object is damaged or degraded may be relatively high. For alleviating this problem, the gas cluster ion beam (GCIB) technique for emitting a gas cluster to a processing object as an ion beam is under development. Here, "gas cluster" is a plurality of gas atoms or molecules clustering in a massive form, and "gas cluster ion" is a gas cluster ionized. Further, "gas cluster ion beam" is a plurality gas cluster ions in a beam form.

Japanese Patent Application Laid-Open No. H08-120470 discloses an apparatus emitting such a gas cluster ion beam to a target. The configuration of this apparatus will be described below with reference to FIG. 6.

The apparatus shown in FIG. 6 is an apparatus subjecting the processing object to fine polishing processing, and has two vacuum chambers 501 and 502 to which vacuum pumps 511 and 512 are connected, respectively. A source gas supplied from a gas bomb 503 is jetted from a nozzle 504 at a supersonic speed and generates a gas cluster through adiabatic expansion. The generated gas cluster is shaped into a beam form when passing though a skimmer 505, and supplied to an ionization portion 507. In this ionization portion 507, thermal electrons generated when a filament 506 is heated are collided with a gas cluster to perform ionization, whereby the gas cluster becomes a gas cluster ion. The gas cluster ion is then accelerated by an electric field in an acceleration portion 508, and further, clusters are screened according to size by a deceleration field in a deceleration electric field 509. The screened gas cluster ion is accelerated again in the acceleration portion 513, and emitted to a processing object 510 to which a high voltage has been applied.

In a fine polishing processing apparatus having such a configuration, when a gas cluster ion emitted to the processing object 510 is collided and thereby collapses, clustering constituent atoms (or molecules) are scattered to spread over the surface of the processing object 510. Thus, lateral polishing (also called "lateral sputtering") to the surface of the processing object 510 can be performed well.

In addition to the above-mentioned document, Japanese Patent Application Laid-Open No. H08-127867 and Patent Application Laid-Open No. H09-41122 (U.S. Publication No. US2002015803) disclose a thin film formation method using a gas cluster ion beam. Further, National Publication of International Patent Application No. 2003-520393 (U.S. Publication No. US2002162508) discloses a configuration in which a filament is placed near a path of gas cluster emitted so that thermal electrons are vigorously collided with a gas cluster.

However, if for example, a reaction gas (e.g. $SF_6$, $O_2$) is used for a gas for a gas cluster in the case of the configuration in which the gas cluster is ionized using a filament, a problem such that the filament is worn at an early stage due to the influence of such a gas arises. This problem is more significant when the filament is placed near the path of gas cluster emitted. The problem of the filament being worn means that a normal operation cannot be performed over a long time period in the emitting apparatus. From another point of view, time being spent for replacement of the filament causes a reduction in productivity.

Further, in the configuration in which a gas cluster is ionized by thermal electrons from the filament, its efficiency is relatively low, and a more or less improvement is achieved by, for example, making some contrivance on the shape of the filament, but it is not adequate.

Thus, it is an object of the present invention to provide a gas cluster ion beam emitting apparatus capable of normally operating over a long time period. It is another object of the present invention to provide a gas cluster ion beam emitting apparatus and a method for ionization of a gas cluster, which can efficiently ionize a gas cluster.

SUMMARY OF THE INVENTION

For achieving the objects described above, the gas cluster ion beam emitting apparatus of the present invention is a gas cluster ion beam emitting apparatus comprising gas cluster generating and emitting means for generating a gas cluster and emitting the gas cluster to a processing object, and ionization means for emitting electrons to the gas cluster to ionize the gas cluster, wherein the ionization means is an electron gun emitting the electrons.

The method for ionization of a gas cluster of the present invention comprises a step of colliding electrons emitted from an electron gun with a gas cluster to ionize the gas cluster.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

DESCRIPTION OF THE PREFERRED EMBODIMENTS

Embodiments of the present invention will be described below with reference to the drawings

First Embodiment

Figure 1:
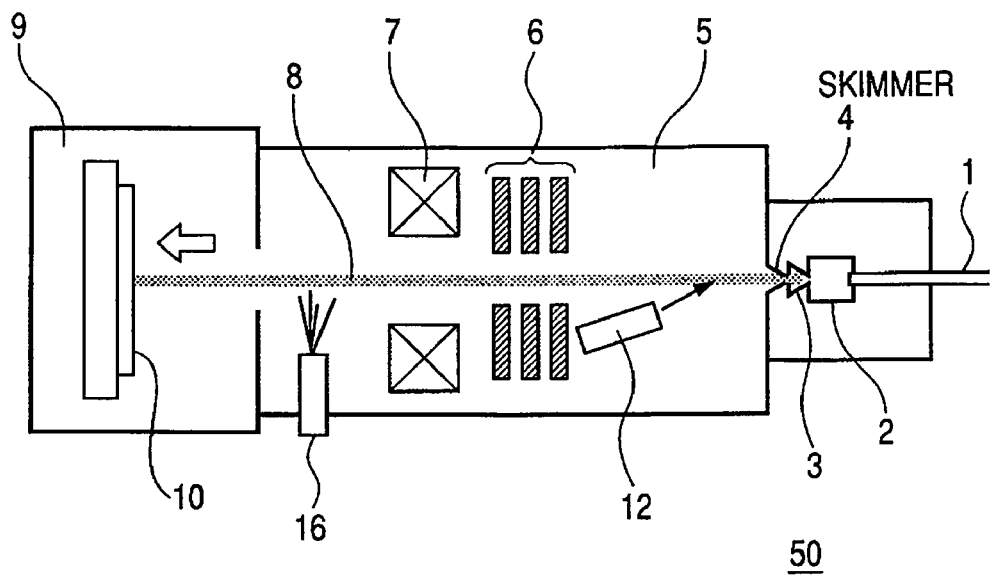
FIG. 1 is a side view showing a general configuration of an emitting apparatus of the first embodiment.

FIG. 1 is a side view showing a general configuration of an emitting apparatus of the first embodiment.

As shown in FIG. 1, an emitting apparatus 50 has two vacuum chambers: a processing chamber 9 in which a substrate 10 as a processing object is placed and an ionization chamber 5 is provided to be adjacent to the processing chamber 9. Vacuum pumps (not shown) are connected to the processing chamber 9 and the ionization chamber 5, respectively, whereby the interiors of both chambers are brought into a vacuum state.

A nozzle 3 jetting a gas cluster is placed on one side face of the ionization chamber 5 (on the right side in the figure). Specifically, the nozzle 3 is attached to a cluster generation chamber 2 to which a gas inlet pipe 1 is connected. As described below these components generate a gas cluster and jet the gas cluster to the processing object 10.

A skimmer 4 is formed opposite to the nozzle 3 on the above-mentioned side face of the ionization chamber 5. The skimmer 4 is a structural part for shaping a stream of gas clusters into a beam form by allowing gas clusters near the center, of a group of clusters jetted from the nozzle 3, to pass. In FIG. 1, a direction of a gas cluster stream 8 is shown by an open arrow, and the direction is vertical to the surface of the processing object 10.

Gases capable of being used in the emitting apparatus 50 include inert gases such as Ar, Kr and Xe and reactive gases such as $CF_4$, $SF_6$, $O_2$, $Cl_2$ and $BCl_3$. A specific example may be $O_2$ having $SF_6$ mixed therein in an amount of about 2% or $O_2$ having $SF_4$ mixed therein in an amount of about 2%, or may be Ar having $Cl_2$ mixed therein in an amount of about 4% or Ar having $BCl_3$ mixed therein in an amount of about 3%. Further, the processing object 10 may be a Si substrate, SiC substrate, diamond substrate, glass substrate or the like.

In the interior of the ionization chamber 5, an electron gun 12, an acceleration portion 6, a separation portion 7 and a neutralizer 16 are placed in this order from the side of the upstream of the gas cluster stream 8. The emitting apparatus 50 of this embodiment is principally characterized in that the electron gun 12 is used instead of the conventional filament as means for ionizing a gas cluster, and for the acceleration portion 6, the separation portion 7 and the neutralizer 16, configurations same as conventional configurations can be used.

The acceleration portion 6 is constituted by, for example, an electrode, and generates an electric field to the gas cluster stream 8 to accelerate a gas cluster ion in the gas cluster stream 8 toward the substrate 10. The separation portion 7 is constituted by, for example, a magnet, and generates a magnetic field to the gas cluster stream 8. In this way, gas cluster ions having a small mass (including monomer ions), of gas cluster ions passing through the separation portion 7, have their traveling direction changed by the action of this magnetic field. Thus, gas cluster ions passing through the separation portion 7 have uniform size. The neutralizer 16 is constituted by an electron gun emitting electrons to the gas cluster stream 8, and is intended for neutralizing a gas cluster ion.

The configuration and layout of the electron gun 12 will now be described in detail.

The electron gun 12 comprises a negative electrode discharging electrons and a positive electrode acceleratingly emitting the discharged electrons to outside, and its type may be a cold cathode type, or may be a hollow cathode type.

As shown in FIG. 1, the electron gun 12 is placed at a position distant from the gas cluster stream 8 so as not to interfere with the gas cluster stream 8. The electron gun 12 is placed in a slanting state so that the traveling direction of electrons emitted from the electron gun 12 and the direction of the gas cluster steam 8 forms a predetermined angle.

Figure 5:
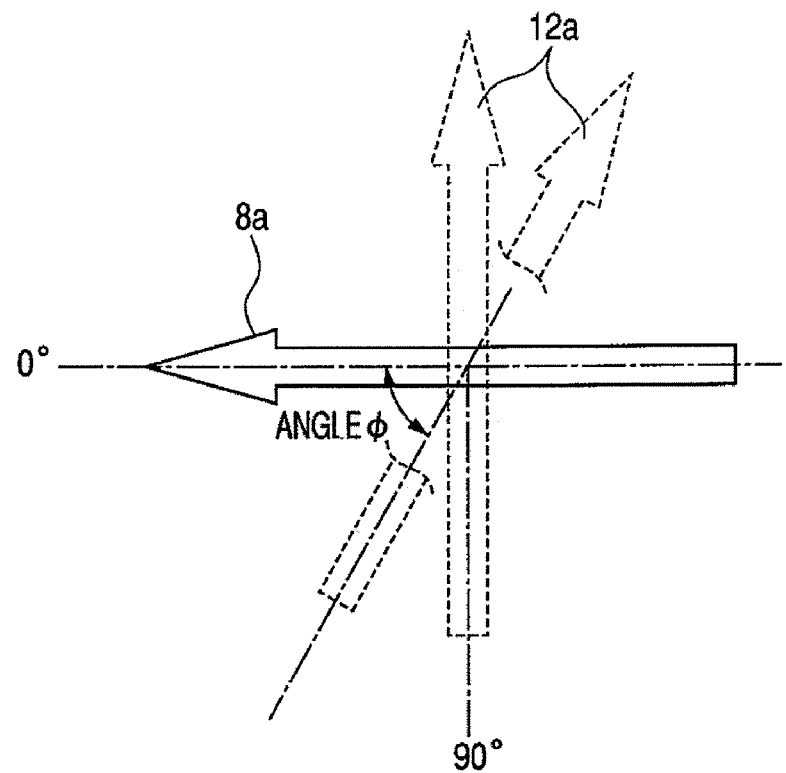
FIG. 5 is a view for explaining a direction in which electrons travel with respect to a gas cluster stream.
Figure 6:
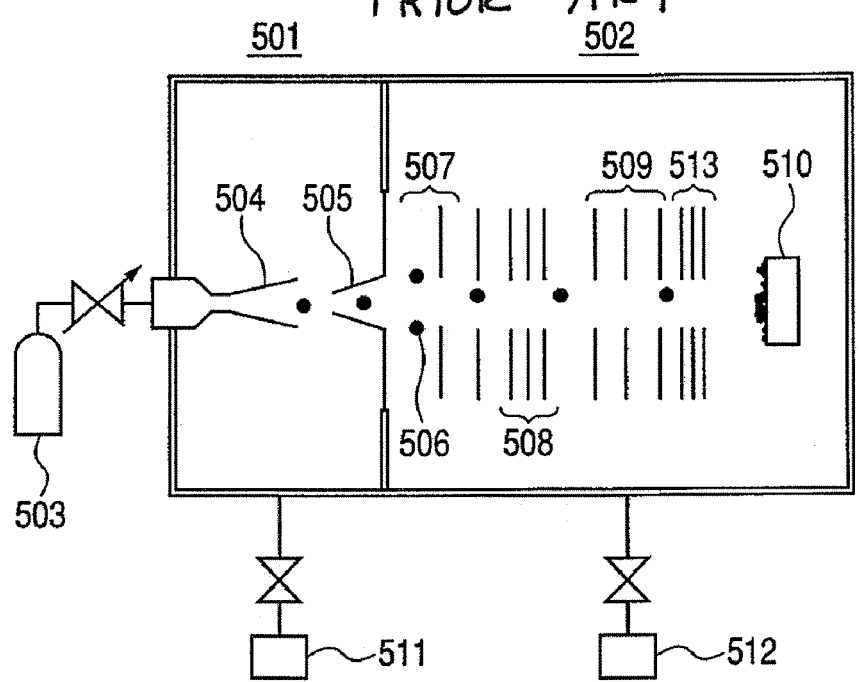
FIG. 6 is a side view showing an example of a configuration of a conventional gas cluster ion beam emitting apparatus.

This "predetermined angle" will now be described with reference to FIG. 5. The angle is an angle of a traveling direction 12a of electrons with respect to a direction 8a of the gas cluster stream, and it is preferably in the range of $0°<\phi<90°$, more preferably in the range of $5°\leq\phi\leq45°$. In short, the electron should only have a velocity component toward the right in the lateral direction in the figure. Such a traveling direction of electrons will be hereinafter referred to as "opposite direction". In this way, electrons are implanted in the "opposite direction", whereby a gas cluster is efficiently ionized.

In the configuration in FIG. 1, it is considered that achievement of the angle=0° is practically impossible in view of circumstances where the electron gun 12 is placed, but it is possible in the configurations in second to fourth embodiments described later. The present invention is not limited to the configuration in which electrons are implanted in the "opposite direction" as described above, but even in a configuration in which electrons are implanted, for example, at an angle=90° (i.e. vertically to the gas cluster stream 8), the action effect of the present invention by using the electron gun 12 in stead of the filament as described later can be obtained.

Operations of the emitting apparatus 50 of this embodiment configured as described above will be described below.

First, a gas supplied from the gas inlet pipe 1 is jetted from the nozzle 3 to the skimmer 4 by way of the cluster generation chamber 2. The gas exiting from the nozzle 3 adiabatically expands and clusters as the temperature decreases. Gas clusters near the center of a group of gas clusters thus generated are left when passing through the skimmer 4, and thereby become the gas cluster stream 8 in a beam form.

In the ionization chamber 5, electrons are emitted from the electron gun 12 to the gas cluster stream 8. In this way, gas clusters in the gas cluster stream 8 are ionized to become gas cluster ions. The gas cluster ions thus ionized are further accelerated toward the substrate 10 in the acceleration portion 6. Gas cluster ions having a small mass; of gas cluster ions passing through the acceleration portion 6, have their traveling direction changed in the separation portion 7, and are removed. Gas cluster ions thus screened to have a predetermined size are neutralized by the neutralizer 16 and collided with the surface of the processing object 10. The emitting apparatus 50 of this embodiment appropriately makes use of the collision of gas cluster ions to process the processing object 10, and can perform not only polishing processing but also thin film formation processing of forming a thin film on the surface of a substrate.

According to the emitting apparatus 50 of this embodiment configured as described above, first, the problem of the filament being worn is solved because as means for ionizing a gas cluster, the electron gun 12 is used instead of the filament. Namely, in the case of the electron gun, the electron gun 12 can be placed at a distance from the gas cluster stream 8, and therefore it is not worn by a gas. Thus, the emitting apparatus 50 can normally operate over a long time period, and process the processing object 10 with good productivity because it is not necessary to replace the filament. Ionization by electrons from the electron gun 12 also has an advantage of high efficiency compared to ionization by electrons from the filament. Further, as shown in FIG. 5, electrons from the electron gun 12 are implanted to the gas cluster stream in the "opposite direction" to the direction of the gas cluster stream, and therefore the gas cluster is more efficiently ionized. As described previously, the gas capable of being used in the emitting apparatus 50 may be any of a reactive gas and an inert gas, but it can be said that the present invention is particularly useful when a reactive gas is used in light of the fact that the problem of the filament being worn occurs when a reactive gas is used.

Second Embodiment

Figure 2:
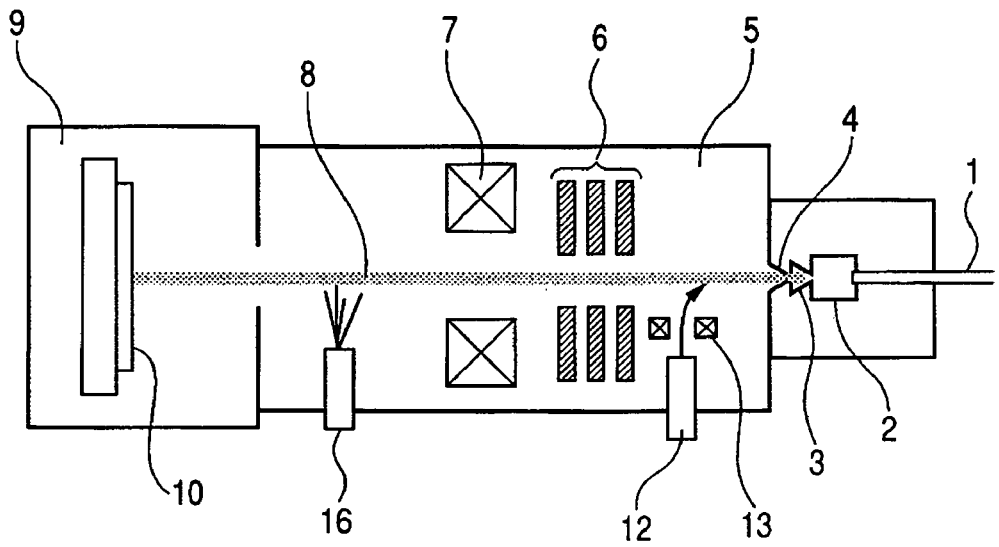
FIG. 2 is a side view showing a general configuration of an emitting apparatus of the second embodiment.

In the first embodiment, the electron gun 12 is placed aslant to emit electrons from the opposite side of the gas cluster stream, but the present invention is not limited thereto. FIG. 2 is a side view showing a general configuration of an emitting apparatus of the second embodiment. In FIG. 2, structural parts same as those of FIG. 1 are given symbols same as those of FIG. 1, and explanations thereof are not presented.

As shown in FIG. 2, an emitting apparatus 51 has an electron gun 12 placed to emit electrons in a direction orthogonally crossing the gas cluster stream 8, and a member for changing a direction 13 for changing the traveling direction of electrons emitted from the electron gun 12. The member for changing a direction 13 is constituted by a magnet, and diverts the traveling direction of electrons to a direction opposite to the gas cluster stream 8 by its magnetic force.

Even in the configuration in which the traveling direction of electrons is diverted by the action of a magnetic field by the member for changing a direction 13 in this way, an action effect same as that of the first embodiment can be obtained because electrons from the electron gun 12 are implanted in a direction opposite to the gas cluster stream 8 as in the first embodiment. According to such a configuration, electrons can be implanted from the directly opposite side of the gas cluster stream 8, i.e. in the direction of the angle=0° shown in FIG. 5, by appropriately adjusting the magnitude of the magnetic field.

Third Embodiment

Figure 3:
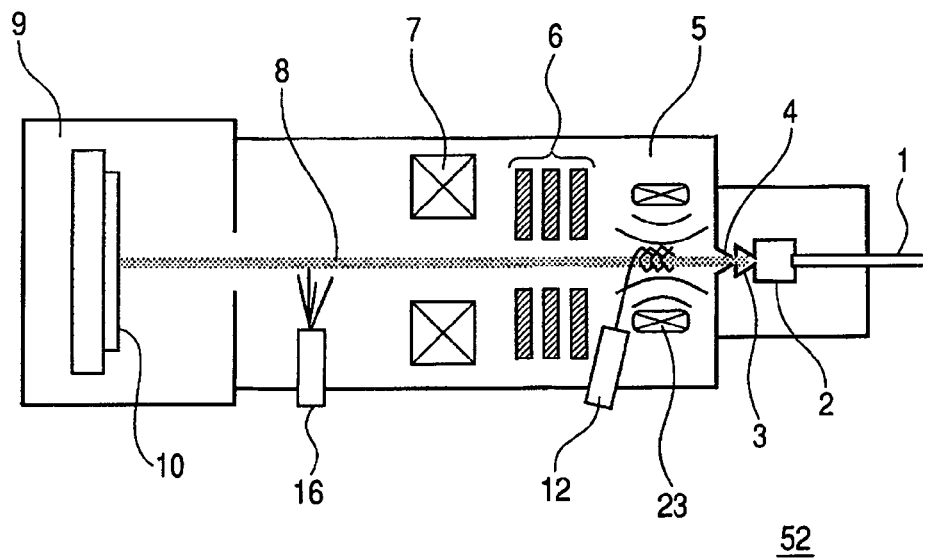
FIG. 3 is a side view showing a general configuration of an emitting apparatus of the third embodiment.

For further improving the efficiency of ionization of a gas cluster by electrons emitted from the electron gun 12, the emitting apparatus may be made to have a configuration shown in FIG. 3. FIG. 3 is a side view showing a general configuration of an emitting apparatus of the third embodiment. In FIG. 3, structural parts same as those of FIG. 1 are given symbols same as those of FIG. 1, and explanations thereof are not presented.

As shown in FIG. 3, an emitting apparatus 52 has an electron gun 12 placed to implant electrons to the gas cluster stream 8 in an opposite direction as in the configuration of the first embodiment, and a member for changing a direction 23 for changing the traveling direction of emitted electrons. The member for changing a direction 23 is constituted by an annular coil, and placed to share an axial line with the gas cluster stream 8. A current is made to pass through this coil to generate a magnetic field, and this magnetic field makes electrons travel helically through or around the gas cluster stream 8.

According such a configuration, electrons emitted from the electron gun 12 helically travel through or around the gas cluster stream 8 due to the action of the magnetic field by the member for changing a direction 23, and therefore pass through the gas cluster stream multiple times, and thus efficiency of ionization is improved.

Fourth Embodiment

Figure 4:
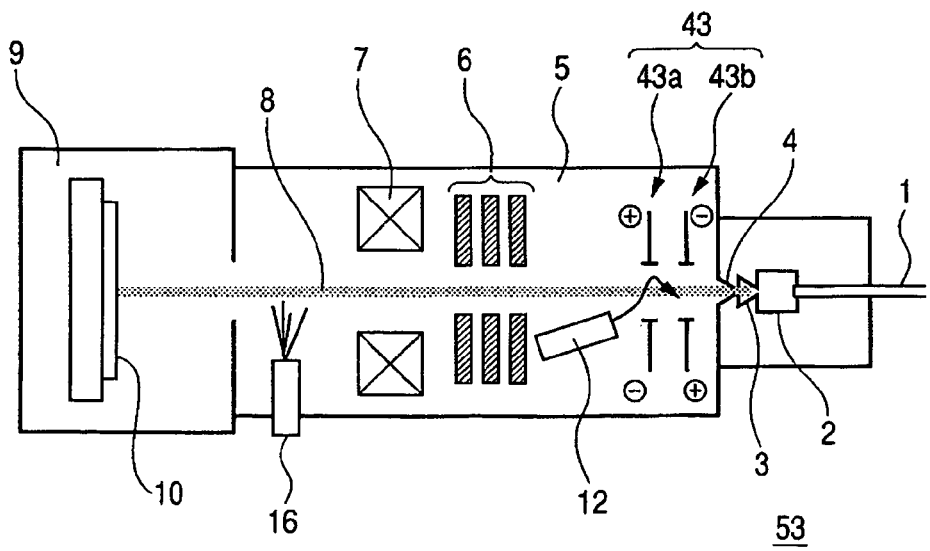
FIG. 4 is a side view showing a general configuration of an emitting apparatus of the fourth embodiment.

The members for changing a direction in second and third embodiments divert the traveling direction of electrons by the action of the magnetic field of the members for changing a direction 13 and 23, but the present invention is not limited thereto, and the traveling direction of electrons may be diverted by the action of the electric field. FIG. 4 is a side view showing a general configuration of an emitting apparatus of the fourth embodiment. In FIG. 4, structural parts same as those of FIG. 1 are given symbols same as those of FIG. 1, and explanations thereof are not presented.

As shown in FIG. 4, an emitting apparatus 53 has an electron gun 12 placed to implant electrons to the gas cluster stream 8 in an opposite direction as in the configuration of the first embodiment, and a member for changing a direction 43 for changing the traveling direction of electrons. The member for changing a direction 43 comprises two electrode pairs 43a and 43b placed opposite to each other with the gas cluster stream 8 held therebetween, and the electrode pairs 43a and 43b are mutually spaced at a predetermined interval in the direction of the gas cluster stream 8. DC voltages are applied to the electrode pairs 43a and 43b to have reversely positive and negative poles, whereby electric fields of opposite characteristics are generated between the electrode pairs 43a and 43b.

According to such a configuration, electrons emitted from the electron gun 12 pass in such a manner as to draw a zigzag line with respect to the gas cluster stream 8 multiple times by the action of the electric fields of opposite characteristics generated between the electrode pairs 43a and 43b. Thus, the probability that electrons are collided with the gas cluster increases, resulting in an improvement in efficiency of ionization.

The present invention has been described taking first to fourth embodiments as examples, but the components shown in these embodiments may be used in combination as appropriate. FIG. 4 shows a configuration in which two electrode pairs 43a and 43b are placed, but three or more electrode pairs may be placed.

This application claims priority from Japanese Patent Application No. 2004-351541 filed on Dec. 3, 2004, which is hereby incorporated by reference herein.

What is claimed is:

1. A gas cluster ion beam emitting apparatus comprising:
   gas cluster generating and emitting means for generating a gas cluster and emitting the gas cluster to a processing object; and
   an electron gun configured to emit electrons in a direction opposite to a direction in which said gas cluster is emitted to collide said electrons with said gas cluster.

2. The gas cluster ion beam emitting apparatus according to claim 1, wherein an angle $\phi$ between the direction in which said electrons are collided with said gas cluster and the direction in which said gas cluster is emitted is $0° < \phi < 90°$.

3. The gas cluster ion beam emitting apparatus according to claim 2, wherein said angle $\phi$ is $5° \leq \phi \leq 45°$.

4. The gas cluster ion beam emitting apparatus according to claim 1, wherein said electron gun further comprises direction changing means for changing the traveling direction of said electrons emitted.

5. The gas cluster ion beam emitting apparatus according to claim 4, wherein said direction changing means generates a magnetic field.

6. The gas cluster ion beam emitting apparatus according to claim 4, wherein said direction changing means is a coil generating an electric field, and the coil is placed to surround a path of said gas cluster emitted.

7. The gas cluster ion beam emitting apparatus according to claim 4, wherein said direction changing means is two or more electrode pairs placed opposite to one another with the path of said gas cluster emitted held therebetween, and the electrode pairs are mutually spaced in the direction in which said gas cluster is emitted.

8. A method for ionizing a gas cluster, comprising a step of colliding electrons emitted from an electron gun with a gas cluster in a direction opposite to a direction in which said gas cluster is emitted to ionize said gas cluster.

9. The gas cluster ion beam emitting apparatus according to claim 1, wherein the electron gun is configured to emit electrons in a direction converging with the gas cluster stream.

* * * * *